(12) United States Patent
Lilja

(10) Patent No.: US 11,374,567 B2
(45) Date of Patent: Jun. 28, 2022

(54) CIRCUIT FOR LOW POWER, RADIATION HARD LOGIC CELL

(71) Applicant: Klas Olof Lilja, Pleasanton, CA (US)

(72) Inventor: Klas Olof Lilja, Pleasanton, CA (US)

( * ) Notice: Subject to any disclaimer, the term of this patent is extended or adjusted under 35 U.S.C. 154(b) by 0 days.

(21) Appl. No.: 15/430,484

(22) Filed: Feb. 11, 2017

(65) Prior Publication Data

US 2019/0081627 A1 Mar. 14, 2019

(51) Int. Cl.
| | | |
|---|---|---|
| *H03K 19/00* | (2006.01) | |
| *H03K 3/03* | (2006.01) | |
| *G11C 11/41* | (2006.01) | |
| *H03K 3/037* | (2006.01) | |
| *G11C 11/412* | (2006.01) | |
| *H03K 23/00* | (2006.01) | |
| *H03K 3/012* | (2006.01) | |
| *H03K 19/003* | (2006.01) | |
| *G11C 11/413* | (2006.01) | |
| *G11C 11/419* | (2006.01) | |

(52) U.S. Cl.
CPC ........ *H03K 19/0013* (2013.01); *G11C 11/412* (2013.01); *G11C 11/413* (2013.01); *G11C 11/419* (2013.01); *H03K 3/012* (2013.01); *H03K 3/0372* (2013.01); *H03K 3/0375* (2013.01); *H03K 19/0033* (2013.01); *H03K 23/002* (2013.01)

(58) Field of Classification Search
CPC ............. H03K 19/00338; H03K 19/20; H03K 3/0375; H03K 19/0033; H03K 19/215; H03K 21/10; H03K 17/102; H03K 17/161; H03K 17/284; H03K 19/007; H03K 19/0948; H03K 5/1252; G11C 11/412; G11C 29/52; G11C 5/005
See application file for complete search history.

(56) References Cited

U.S. PATENT DOCUMENTS

| | | | | |
|---|---|---|---|---|
| 7,142,004 B2* | 11/2006 | Calrson | ............ | H03K 19/00338 326/10 |
| 8,014,184 B1* | 9/2011 | Lesea | .................... | G11C 11/412 365/154 |
| 8,081,010 B1* | 12/2011 | Whitaker | ........... | H03K 19/0075 326/11 |
| 8,495,550 B2* | 7/2013 | Lilja | .................. | G06F 17/5068 326/10 |
| 8,566,770 B2* | 10/2013 | Lilja | .................. | G06F 17/5068 326/12 |
| 8,604,825 B2* | 12/2013 | Eaton | ............... | H03K 19/00338 326/10 |
| 8,773,929 B1* | 7/2014 | Lesea | .................. | G11C 11/4125 365/154 |

(Continued)

FOREIGN PATENT DOCUMENTS

WO WO 2014066402 A1 * 5/2014 ....... H03K 19/00338

*Primary Examiner* — Vibol Tan

(57) ABSTRACT

This invention comprises a new way to connect a control, CK, and data, D, signal into a basic cross-coupled INV pair, and into certain other basic sequential logic circuits, to control the writing in of a new data value, D, into the sequential logic circuit cell. The invention concerns logic circuit in complementary metal-oxide-semiconductor (CMOS) technology. It connects additional p-type and n-type MOSFET devices in a novel manner to accomplish the desired control functions.

2 Claims, 20 Drawing Sheets

(56) References Cited

U.S. PATENT DOCUMENTS

| | | | |
|---|---|---|---|
| 9,013,219 B2* | 4/2015 | Cabanas-Holmen | ........................ H03K 3/012 327/199 |
| 9,083,341 B2* | 7/2015 | Lilja | ..................... H03K 19/215 |
| 9,191,009 B1* | 11/2015 | Clark | ..................... H03K 19/23 |
| 9,369,087 B2* | 6/2016 | Burgener | ............... H01Q 23/00 |
| 2014/0157223 A1* | 6/2014 | Lilja | ................... G06F 17/5068 716/138 |

* cited by examiner

CIRCUIT FOR LOW POWER, RADIATION HARD LOGIC CELL

CROSS REFERENCE TO RELATED APPLICATIONS

This application is a non-provisional utility application claiming priority to U.S. provisional application No. 62/389,050 filed Feb. 13, 2016, and to U.S. provisional patent No. 62/388,295 filed Jan. 20, 2016.

BACKGROUND OF THE INVENTION

This invention comprises a circuit for a sequential logic cell. Sequential logic cells are used in logic integrated circuits to temporarily store a data value. A sequential logic cell consist of the circuit that keeps a certain data signal, at least one output connection which provides the stored value to other parts of the IC circuits, one data input connection (D), which provides a new data value to be stored by the sequential element, one control input connection (CK) which determines if and when the new data on the data input (D) should be written into the sequential cell. In addition a sequential logic cell may contain additional input connections to change the data stored by the cell. Such additional signals include clear (CLR) and preset (PRESET) which sets the value stored by the cell regardless of the value on the data (D) input. The basic sequential logic cells are the latch and the static random access memory cells. Another common sequential logic cell is the flip-flop.

This invention is concerned with sequential logic cells used in complementary metal oxide semiconductor (CMOS) technology. This technology is the most common technology used in integrated circuits (ICs) today. It uses two types of metal oxide semiconductor field effect transistors (MOSFET), the n-type MOSFET and the p-type MOSFET, to form the logic circuitry of the IC. CMOS technology and MOSFET devices are well known to anyone familiar with integrated circuits, and these terms are used to describe a specific type of logic circuits and semiconductor devices, regardless of specific materials used to manufacture the devices and circuits.

Sequential logic cells are used very frequently in a logic IC and their electrical performance (speed, power), size, and reliability are very important factors for the overall performance and quality of an IC. This invention comprises a certain way to connect n-type MOSFETs and p-type MOSFETs to form the circuit for the sequential elements which improves the electrical performance of the sequential cell vs. prior art, and which improves certain reliability aspects of the sequential cell vs. prior art.

PRIOR ART

The invention will be described for a basic latch or SRAM sequential cell which consist of two cross-coupled inverter cells (INVs). In this circuit the ability to store a data value is accomplished by connecting the output of a first inverter circuit cell (INV) to the input of a second INV, and connecting the output of the second INV to the input of the first INV. In CMOS technology this circuit is realized by two INVs consisting of a p-type MOSFET and an n-type MOSFET connected in series between a high data signal, being the high electric potential, VDD, of the logic circuit, and a low data signal, being the low electric potential of the logic circuit. This basic circuit is shown in FIG. 1. This circuit can be in one of two states. In one state the output of the first INV is LOW (VSS) and the output of the second INV is HIGH, VDD. In the other state the output of the first INV is HIGH, VDD, and the output of the second INV is LOW, VSS.

In order to switch this circuit between the two states, additional MOSFETs, and input connections, must be added to the circuit. In prior art three main different ways to accomplish this have been applied; commonly referred to as the clock-inverter (clocked-INV) circuit (also referred to as the tri-state inverter circuit), the transmission-gated (TG) circuit, and the SRAM clocking circuit. FIG. 2 shows the first prior art circuit (clocked-INV). In this circuit a first input connection (D) is provided, which provides the value of the new data to be stored, and a second input connection, CK, is provided, which controls whether the circuit should write in the new data, or keep the prior data. The circuit operates as follows: when the control signal, CK, has a first value (HIGH in the circuit in FIG. 2), the basic cross-coupled INV is connected as in the original circuit, and the circuit keeps its' current value. However, when the control signal, CK, has a second value, complementary (opposite) to the first value (LOW in the circuit in FIG. 2), the connection between the two INVs in the basic cross-coupled INV is broken, and, at the same time, the new data input connection, D, is connected into the circuit. Hence, the new data value, D, will be written into the circuit.

Two different versions of the second prior art circuit, which uses a TG to control the writing in of new data, are shown in FIGS. 3 and 4. As with the clocked-INV circuit, the control signal, CK, is used to write in a new data value, D, by both disconnecting the original cross-coupled INV circuit and connecting the new data value, D, into the circuit.

The SRAM prior art circuit is shown in FIG. 5. In this circuit the control signal, CK, does not disconnect the basic cross-coupled INV circuit. Instead, when a new value should be written in, the input data signal D, is connected to the output of one of the INVs in the original circuit, and the complementary of D (opposite value) is connected to the output of the other INV. Hence the switching to the new data value is accomplished by overwriting both values (output of both INVs) of the basic cross-coupled INV circuit.

In the clocked-INV and TG prior art circuits discussed above, the complementary signal, CKB, of the control signal, CK, is required to accomplish the writing in of data. This means that this signal, CKB, either must be generated by inverting the control signal, CK, in the logic cell, or it must be provided to the cell from the outside fully synchronously with the primary control signal, CK. In today's logic circuit design the former is by far the most common way to generate the complementary control signal inside the sequential logic cell.

The prior art SRAM circuit only the primary control signal is required, i.e., it is not necessary to provide or generate the complement of the control signal. However, the circuit requires both the primary data signal, D, and its' complement, Db. This clocking is used in practically all SRAM memory circuit today, and the complementary data signal, Db, is generated outside the cell itself. Since the SRAM circuit does not disconnect the basic cross-coupled INV circuit, it also requires that the new signal is strong enough to overwrite the prior value. In standard SRAM memory circuits this is accomplished by making the MOSFETs which are controlled by the control signal somewhat larger than the MOSFETs of the original cross-coupled INVs.

BRIEF DESCRIPTION OF THE INVENTION

This invention comprises a new way to connect a control, CK, and data, D, signal into the basic cross-coupled INV (and certain other basic sequential logic circuits), to control the writing in of a new data value, D, into the sequential logic cell. The primary advantages of this new connection over the prior art clock-INV and TG circuits is that it does not require the complement of the control signal; only the primary control signal, CK, is used. The main advantage over the prior art SRAM circuit is that the new circuit does disconnect the circuit of the original cross-coupled INV when the new data is written in. This means that it is easier to write in the new data, resulting in a lower power and/or faster switching. Another advantage is that this new circuit can be made harder against so called soft-errors.

A first basic variant of the new circuit is shown in FIG. 6. It connects two additional series connected p-type MOSFETs in parallel with the original p-type MOSFET in the basic cross-coupled INV circuit, and two parallel connected n-type MOSFETs in series with the original n-type MOSFETs in the basic cross-coupled INV circuits. The gates of these additional MOSFETs are connected to a control signal, CK, a data signal, D, and the complement of the data signal, Db, such that the basic cross-coupled INV pair is disconnected, and writing of data occurs, when the control signal, CK, is LOW (VSS), whereas, when the control signal CK, is HIGH (VDD), the circuit will keep its' value.

A second basic variant of the new circuit is shown in FIG. 7. Here two additional series connected n-type MOSFETs are connected in parallel with the original n-type MOSFET in the basic cross-coupled INV circuit, and two parallel connected p-type MOSFETs are connected in series with the original p-type MOSFETs in the basic cross-coupled INV circuits. The gates of these additional MOSFETs are connected to a control signal, CK, a data signal, D, and the complement of the data signal, Db, such that the basic cross-coupled INV pair is disconnected, and writing of data occurs, when the control signal, CK, is HIGH (VDD), whereas, when the control signal CK, is LOW, the circuit will keep its' value.

A person familiar with the field of the invention, will recognize that the control functions in the two basic variants in this invention can be implemented for other basic sequential circuits which uses a set of INVs connected in such a way that the data is kept by the circuit. The dual interlocked cell (DICE) is one such circuit. Instead of the two INVs in the basic cross-couple INV circuit, it uses four cross-coupled INVs. By including the control MOSFETs of either of the basic versions of this invention, a DICE circuit with same control of the writing of data into the basic DICE circuit can be constructed. Basic DICE circuits constructed using the first and second variants of this invention are shown in FIGS. 9 and 10 respectively.

BRIEF DESCRIPTION OF THE DRAWINGS AND FIGURES

DETAILED DESCRIPTION OF THE INVENTION AND HOW IT WORKS

In CMOS logic circuits n-type and p-type MOSFETs are connected between a HIGH electric potential value (VDD) and a LOW electric potential value (VSS). The value of the logic is determined by whether a circuit net, e.g., the output of a logic cell, is HIGH (representing binary '1') or LOW (binary '0'). Sequential logic cells are cells that keep their value (i.e., the value of their output), unless it's explicitly changed by a control signal.

Figure 1:
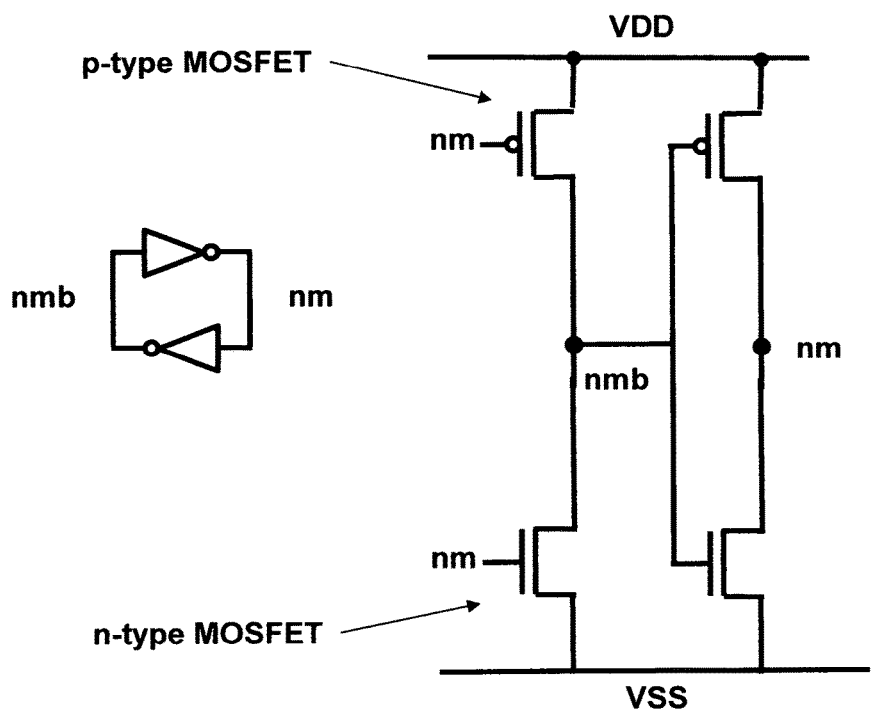
FIG. 1 illustrates the basic cross-coupled INV pair of a sequential logic cell (PRIOR ART).
Figure 2:
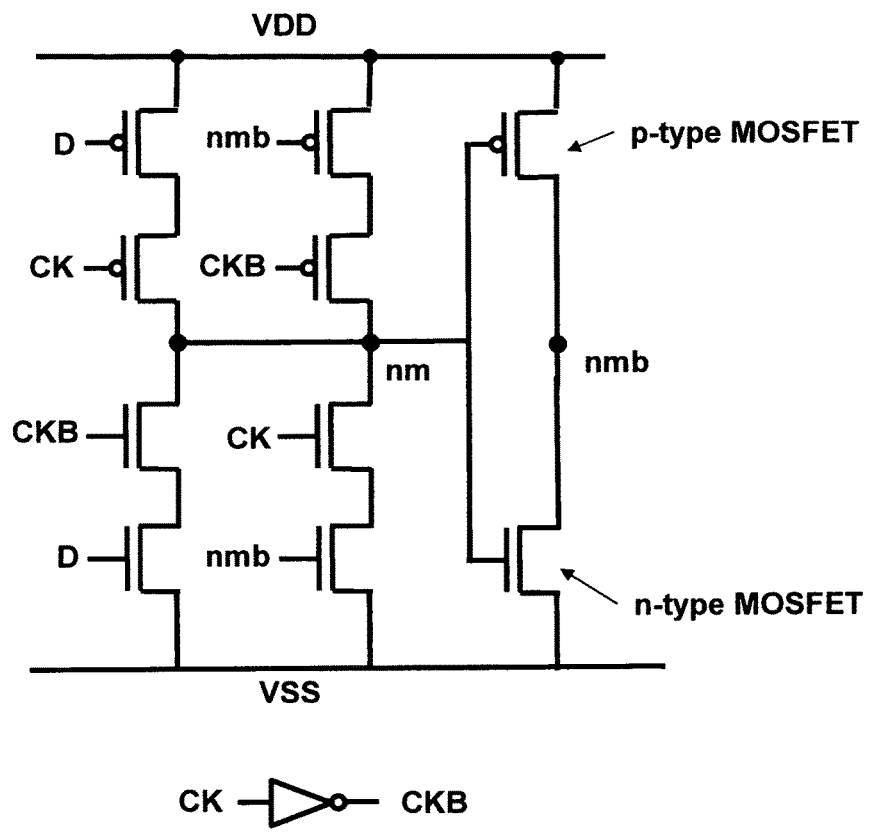
FIG. 2 shows the schematic of a circuit that uses a clocked-INV control of the writing of new data to the basic cross-coupled INV pair (PRIOR ART).
Figure 3:
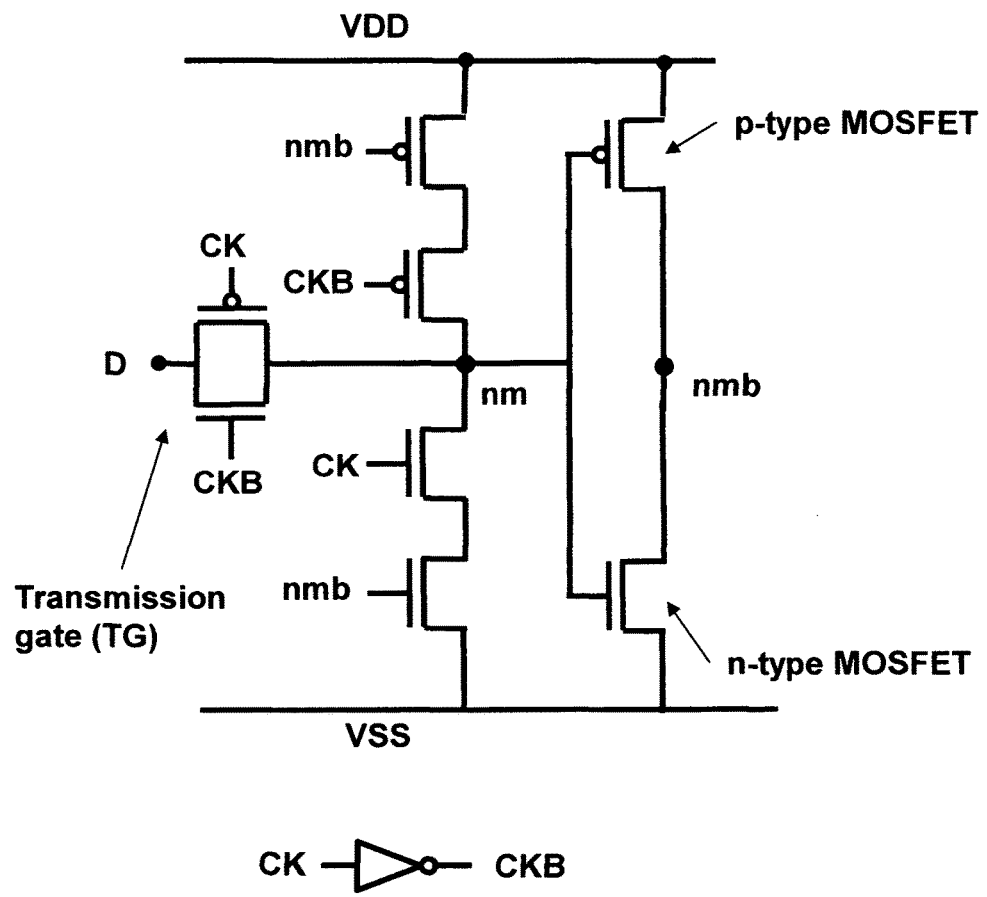
FIG. 3 shows a schematic of a circuit that uses a TG control of the writing of new data to the basic cross-coupled INV pair (PRIOR ART).
Figure 4:
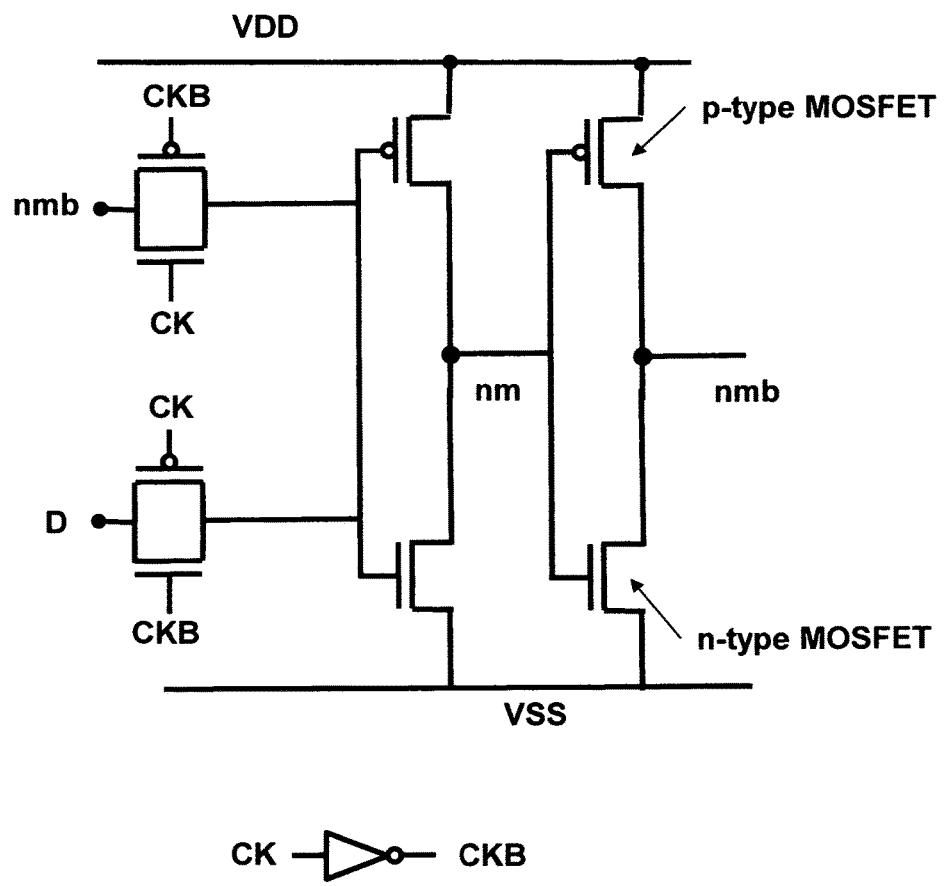
FIG. 4 shows a schematic of a circuit that uses a TG control of the writing of new data to the basic cross-coupled INV pair (PRIOR ART).
Figure 5:
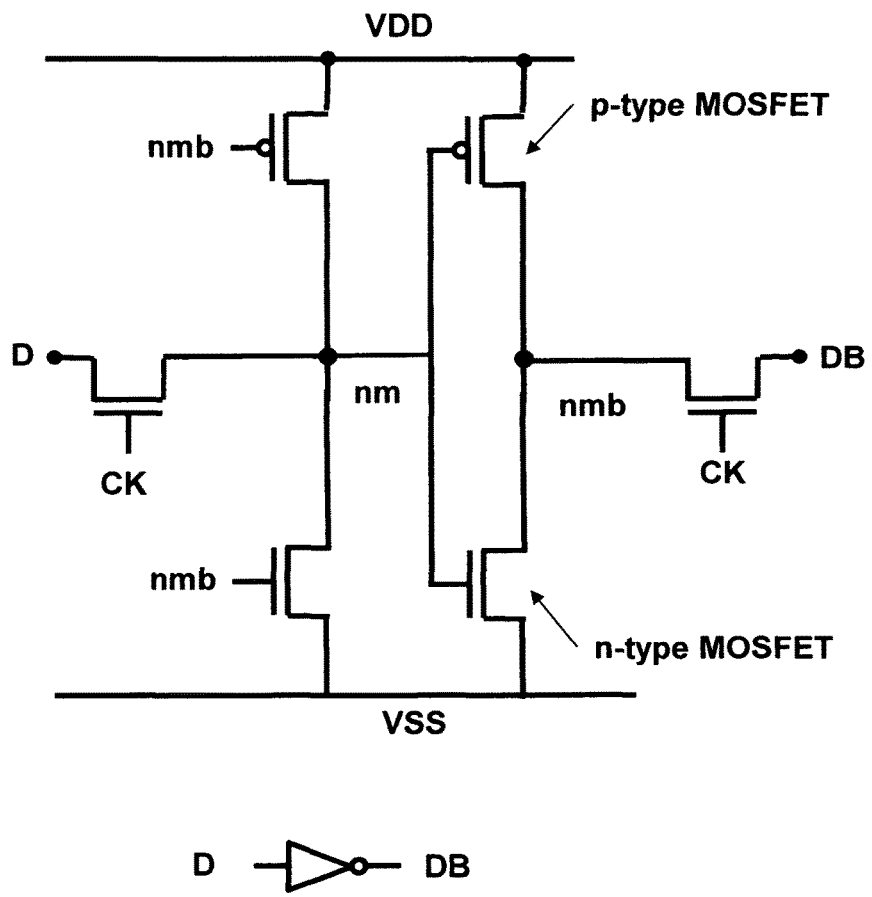
FIG. 5 shows a schematic of a circuit that uses an SRAM type control of the writing of new data to the basic cross-coupled INV pair (PRIOR ART).

This invention comprises a new way to connect a control, CK, and data, D, signal to a basic sequential circuit cell in order to control the writing in of a new data value, D, into the sequential logic cell. The sequential cells of the invention are circuits consisting of two or more CMOS INVs connected in such a way that (in the absence of additional control circuitry) the circuit keeps its' value. These basic circuits include the basic cross-coupled INV circuit (FIG. 1) and the dual interlocked cell (DICE) circuit.

The primary advantages of this new connection over the prior art clock-INV and TG circuits is that it does not require the complement of the control signal; only the primary control signal, CK, is used. The main advantage over the prior art SRAM circuit is that the new circuit does disconnect the circuit of the original cross-coupled INV when the new data is written in. This means that it is easier to write in the new data, resulting in a lower power and/or faster switching. Another advantage is that this new circuit can be made harder against so called soft-errors.

Figure 6:
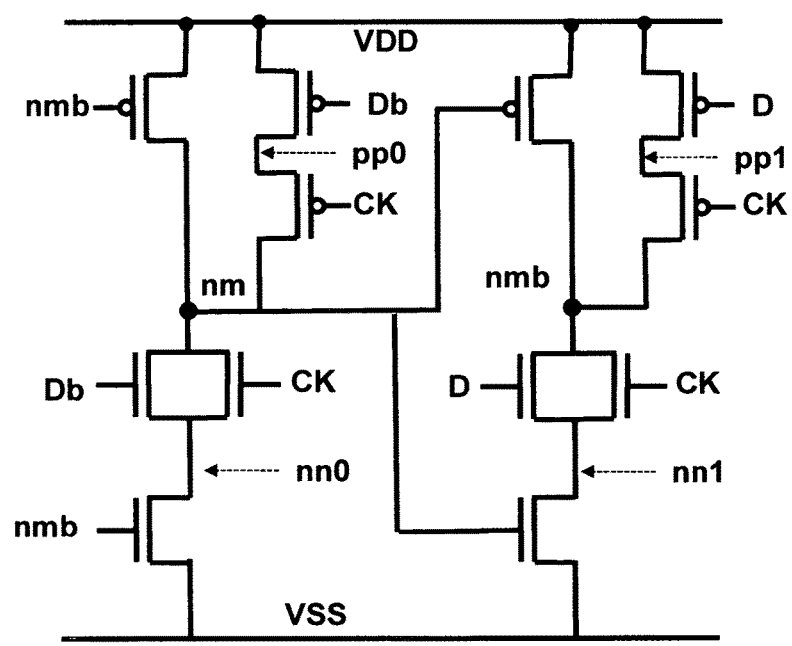
FIG. 6 shows the schematic of the circuit in the first basic variant of this invention.

A first basic variant of the new circuit is shown in FIG. 6. Starting from the basic cross-coupled INV circuit, two series connected p-type MOSFETs are connected in parallel to the p-type MOSFETs in both INVs of the basic cross-coupled INV circuit. These additional p-type MOSFETs are used to write in the new data. The control signal CK is connected to the gate of one of these additional p-type MOSFETs, in each of the two sets of parallel p-type MOSFETS. The gate of the other additional p-type MOSFET is connected to the data input, D, for one of the two basic INVs, and to the complement of D, Db, for the other. When the control signal, CK, is HIGH (VDD) the p-type MOSFETs will be off, and the basic cross-coupled INV will keep its' value. However, when CK goes LOW (VSS) the output of one the basic INVs, will be pulled toward the HIGH (VDD) data value.

Furthermore, two additional parallel connected n-type MOSFETs are added in series with the original n-type MOSFET in the basic cross-coupled INV. The gate of one of these additional n-type MOSFETs is connected to the control signal, CK, the gate of the other is connected to D, for the basic INV for which the gate of additional p-type MOSFET is connected to D, and to Db for the other. When the control signal, CK, is HIGH (VDD) the n-type MOSFET will be on, and the basic cross-coupled INV is NOT disconnected, i.e., it will keep its' value. However, when the control signal, CK, is LOW the additional n-type MOSFETs, which have the control signal connected to their gates, will be off.

If the new input signal, D, is low, the additional n-type MOSFET which has D connected to its' gate will also be off, and the output of the INV of this branch of the original cross-coupled INV (nmb in FIG. 6) will therefore be disconnected from the LOW (VSS) value, i.e., the circuit of the basic cross-coupled INV is disconnected. The output of this INV (nmb) will be pulled HIGH (VDD) without having to over-write the prior value of the circuit. In the other basic INV (where the additional gates are connected to Db) the additional n-type MOSFET, which has Db connected to its' gate, is on, and it simply forms an INV circuit directly controlled by the output of the first INV, nmb. It will also switch without having to over-write the prior value of the circuit.

If the new input signal, D, is HIGH the operation of the writing is equivalent, but now it is the output of the other INV, nm, that is pulled high, and which directly controls the other INV (with nmb on the output).

The first basic variant, described above, writes the new data into the circuit when the control signal, CK, is LOW (VSS). The second basic variant, shown in FIG. 7, operates in the same way as the first basic variant, but it writes the new data signal into the circuit when the value of the control signal, CK, is HIGH (VDD), and keeps its' value when CK is LOW (VSS).

Figure 7:
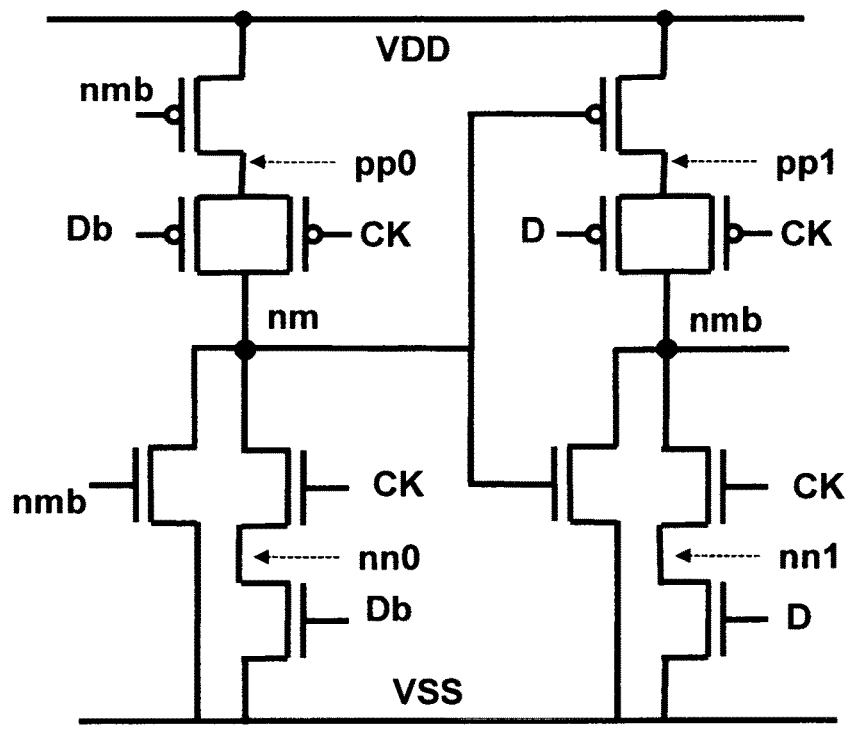
FIG. 7 shows the schematic of the circuit in the second basic variant of this invention.
Figure 7:

In the second variant two additional series connected n-type MOSFETs are connected in parallel with the original n-type MOSFETs in the basic cross-coupled INV circuit, and two parallel connected p-type MOSFETs are connected in series with the original p-type MOSFETs in the basic cross-coupled INV circuit. The gates of one of the n-type, and one of the p-type, MOSFETs, in each branch (for each original INV) in the basic cross-coupled INV circuit is connected to the control signal. The gates of the other additional n-type and p-type MOSFETs are connected to the data signal D, for one branch in the basic cross-coupled INV and to the complement of D, Db, in the other branch. The circuit schematic for the second variant is shown in FIG. 7

Figure 8:
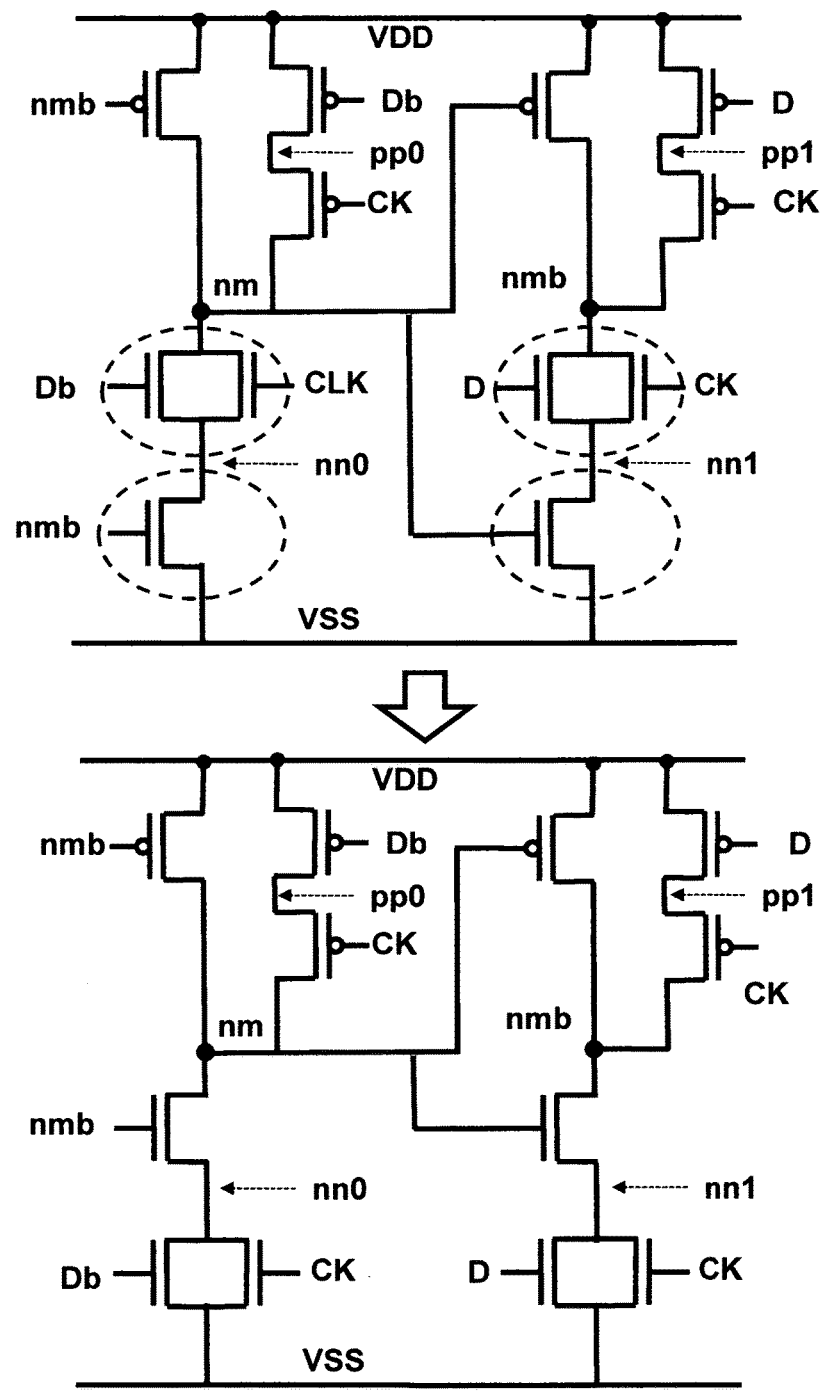
FIG. 8 shows how equivalent circuits are created by changing the order of series connected devices.

In both the first and the second variant, the order of any series connected n-type MOSFETs, and the order of any series connected p-type MOSFETs, do not change the basic function of the circuit. For example the two additional n-type MOSFETs in FIG. 6 could be connected on the other side of the original n-type MOSFETs, i.e., with their sources connected to VSS (see FIG. 8). These variations can be done to all circuits in this invention and are included in the invention.

Figure 9:
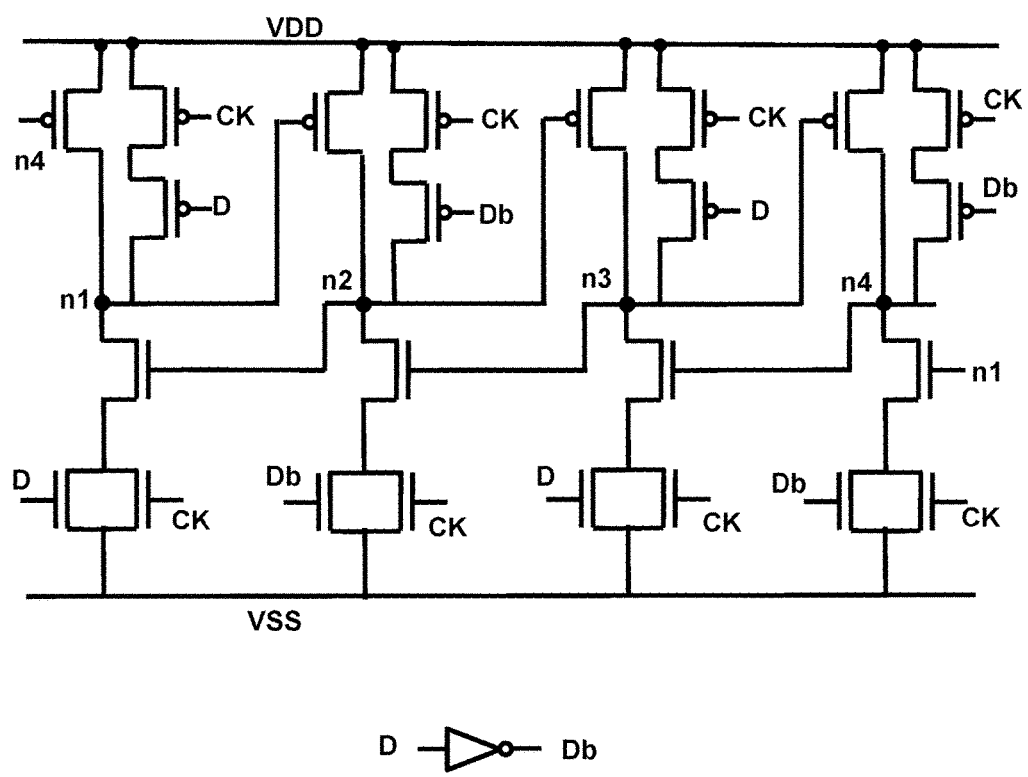
FIG. 9 shows the schematic of a DICE latch circuit using the first variant of this invention.
Figure 10:
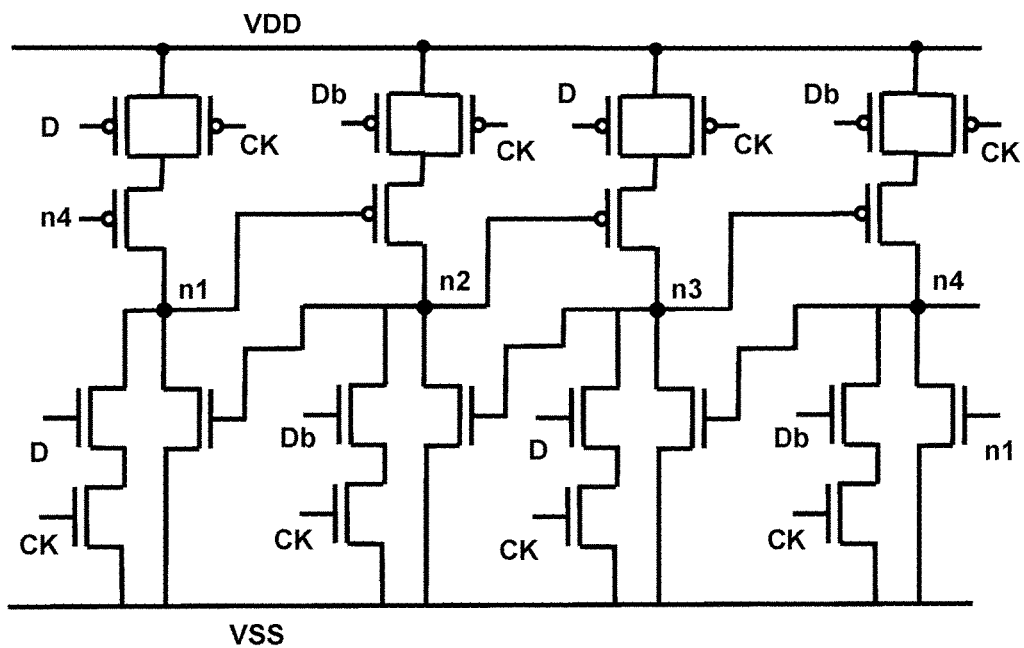
FIG. 10 shows the schematic of a DICE latch circuit using the second variant of this invention.
Figure 10:

Furthermore, a person familiar with the field, will recognize that the control functions in the two basic variants in this invention can be implemented for other basic sequential circuits which uses a set of INVs connected in such a way that the data is kept by the circuit. The dual interlocked cell (DICE) is one such circuit. Instead of the two INVs in the basic cross-couple INV circuit, it uses four cross-coupled INVs. By including the control MOSFETs of either of the basic versions of this invention, a DICE circuit with same control of the writing of data into the basic DICE circuit can be constructed. Basic DICE circuits constructed using the first and second variants of this invention are shown in FIGS. 9 and 10 respectively.

Figure 11:
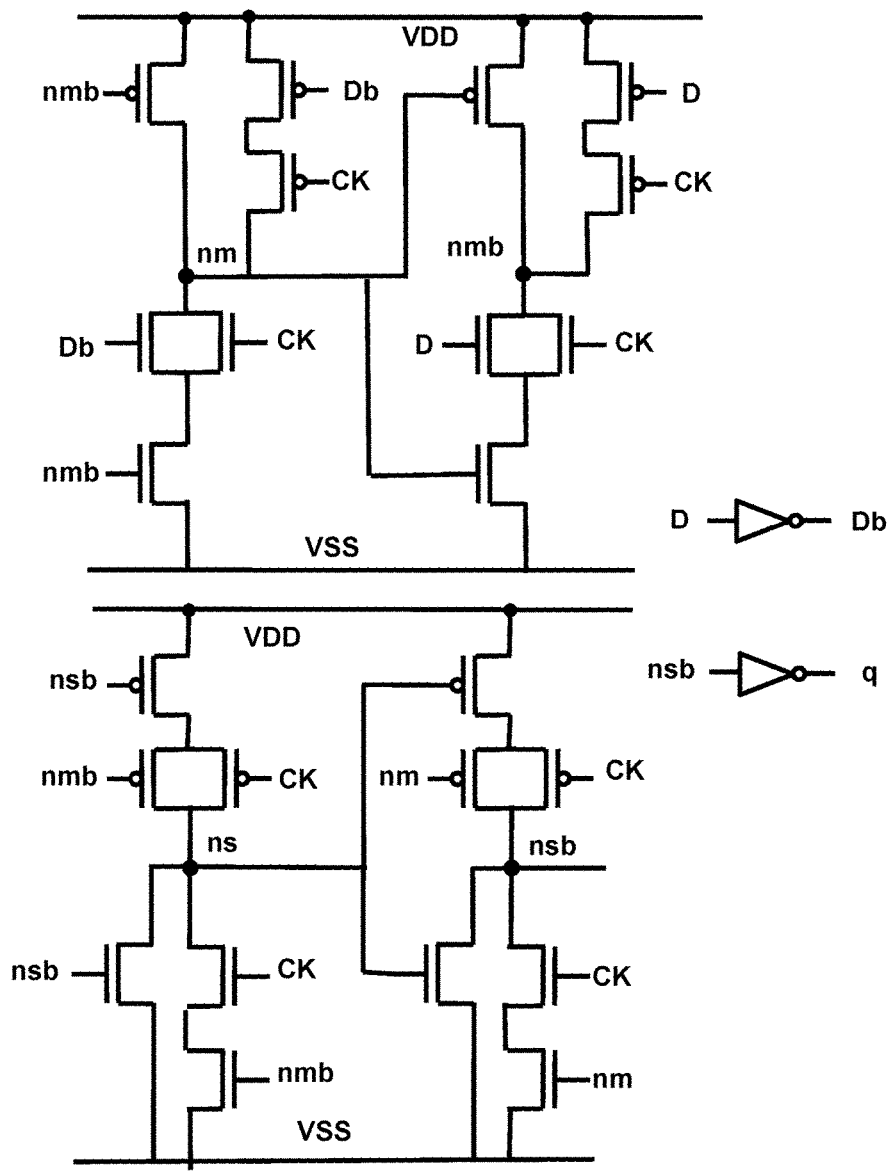
FIG. 11 shows the schematic of a circuit using both the first and second variants of this invention to form a flip-flop circuit.

By connecting a first sequential cell, with a control according to the first variant of this invention, in series with a second sequential cell, with a control according to the second variant of this invention, a flip-flop sequential logic cell it constructed which only uses one control signal (CK), i.e., is does not require the complement of the control signal. Such a flip-flop circuit is shown in FIG. 11.

Figure 12:
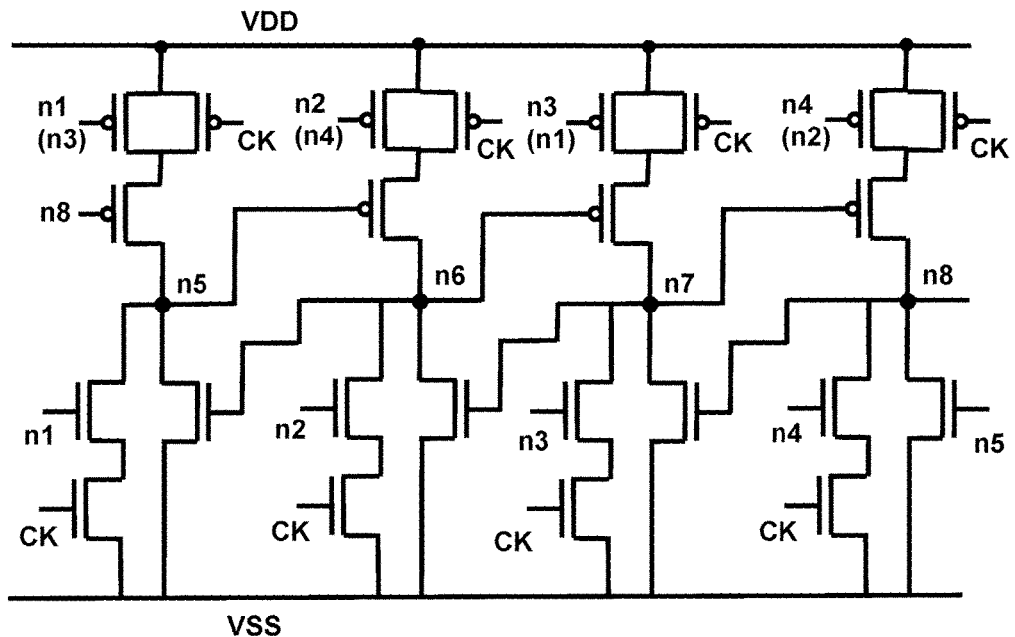
FIG. 12 shows the schematic of the slave latch in a full flip-flop circuit using using the second variant of this invention for a basic DICE circuit. The master latch in this flip-flop is the circuit in FIG. 9.
Figure 12:

In the same way a flip-flop based on the basic DICE configuration can be created by connecting two latches, using the first or the second variant of this invention, applied to the DICE circuit, in series. FIG. 12 shows the slave latch in a DICE based flip-flop using the circuits in the invention. The master latch in this circuit is the DICE-based latch in FIG. 10, which uses the first variant of the invention, the slave latch (FIG. 12) uses the second variant in the invention. The square brackets in FIG. 12 indicate an optional circuit piece (i.e., that can be added optionally). The round bracket indicate an alternate connection (the connections of n2 and n4 from the master, can switch places, as can the connections of n1 and n3).

In standard logic circuit design, sequential logic cells (e.g., latches, flip-flops) are required that have additional control functions, such as the ability to set the data that is kept by the element independently of the regular data input, D, and control, CK, signals. The most common functions are clear (setting the data of the logic cell LOW) and preset (setting the data of the logic cell HIGH). These functions can be synchronous (with the regular control signal CK), or asynchronous, i.e., independent of the regular control signal, CK. Different ways to add these, and other functions, in the prior art sequential cells based on the cross-coupled INV or the DICE circuit, are prior art and familiar to someone familiar with this field.

Both synchronous and asynchronous preset and clear, as well as the common scan function, can be added to the circuits of the first and second variants of this invention in the same way as they are added to the prior art sequential logic cells using the clocked-INV circuit. However, the asynchronous preset and clear functions may also be added to the new circuits in a different new way which avoids introducing more than two series connected MOSFETs of either type anywhere in the circuit. This is accomplished by combining a circuit for the synchronous function with a certain modification of the circuits in the first and second variants of this invention.

Figure 13:
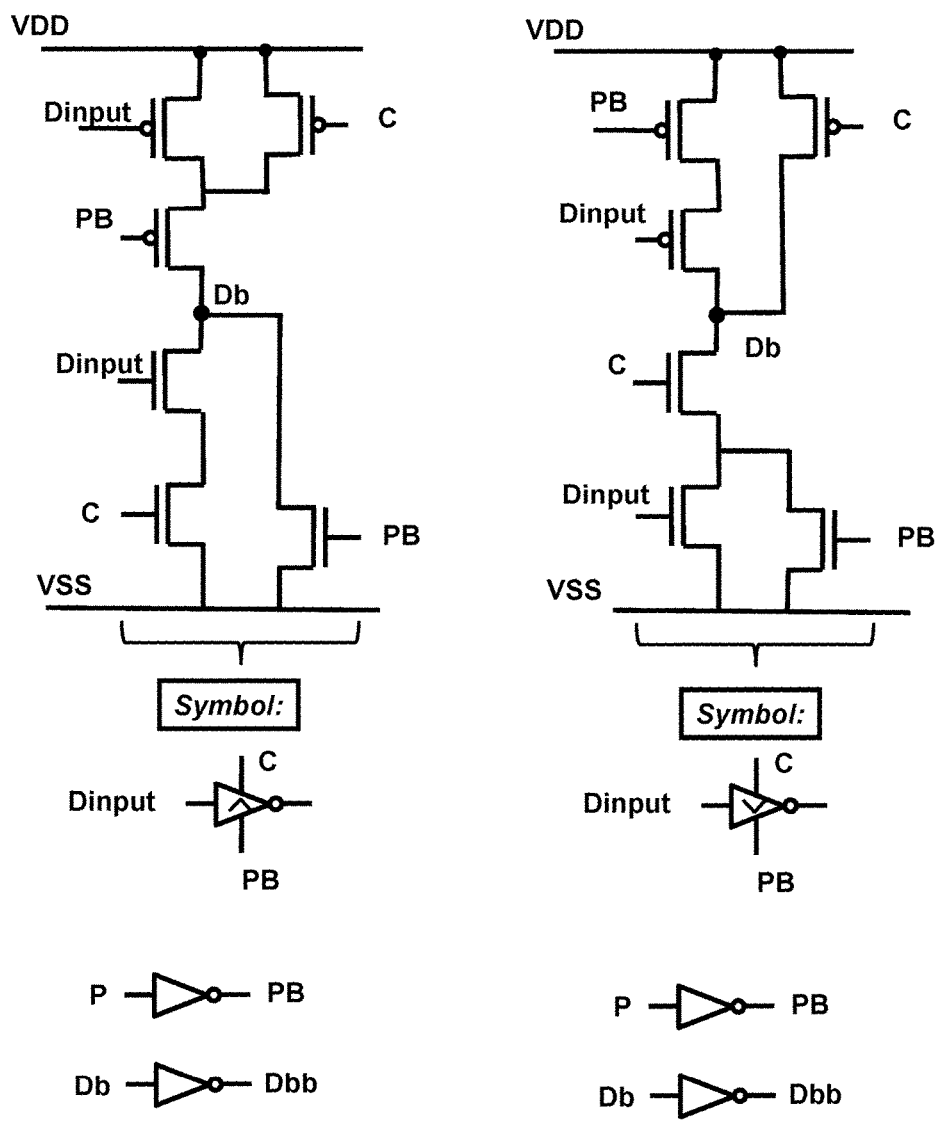
FIG. 13 shows two different circuit for an active LOW synchronous preset and clear function (prior art).

Adding a synchronous preset and clear can be accomplished by adding a control circuit which sets the input signal D to the sequential logic cell to the desired value. This value will then be written into the sequential cell when the regular control signal attains the right value for writing. There are several ways to accomplish this in prior art. FIG. 13 shows two different such circuits (prior art). The purpose of these circuit is to pull the input to the sequential element LOW if the control signal C (clear) goes LOW, and HIGH if the control signal P (preset) goes LOW. If both P and C are high the data value will be equal to the original data input signal (here denoted Dinput). The output of these circuits, Dbb, is the new input data for the sequential logic cell, and the circuits also provide the complement of Dbb, Db, which will be used by the sequential element circuits of this invention.

The circuits in FIG. 13 will be familiar to anyone familiar with this field. They are active low, meaning the P and C signals are active when they are LOW. Both circuits in FIG. 13 operate in the same way, except when both P and C are active (i.e., LOW). In this case (both LOW), the circuit on the left will pull the data high (preset dominant), whereas the circuit on the right will pull the new data signal LOW (clear dominant).

Figure 14:
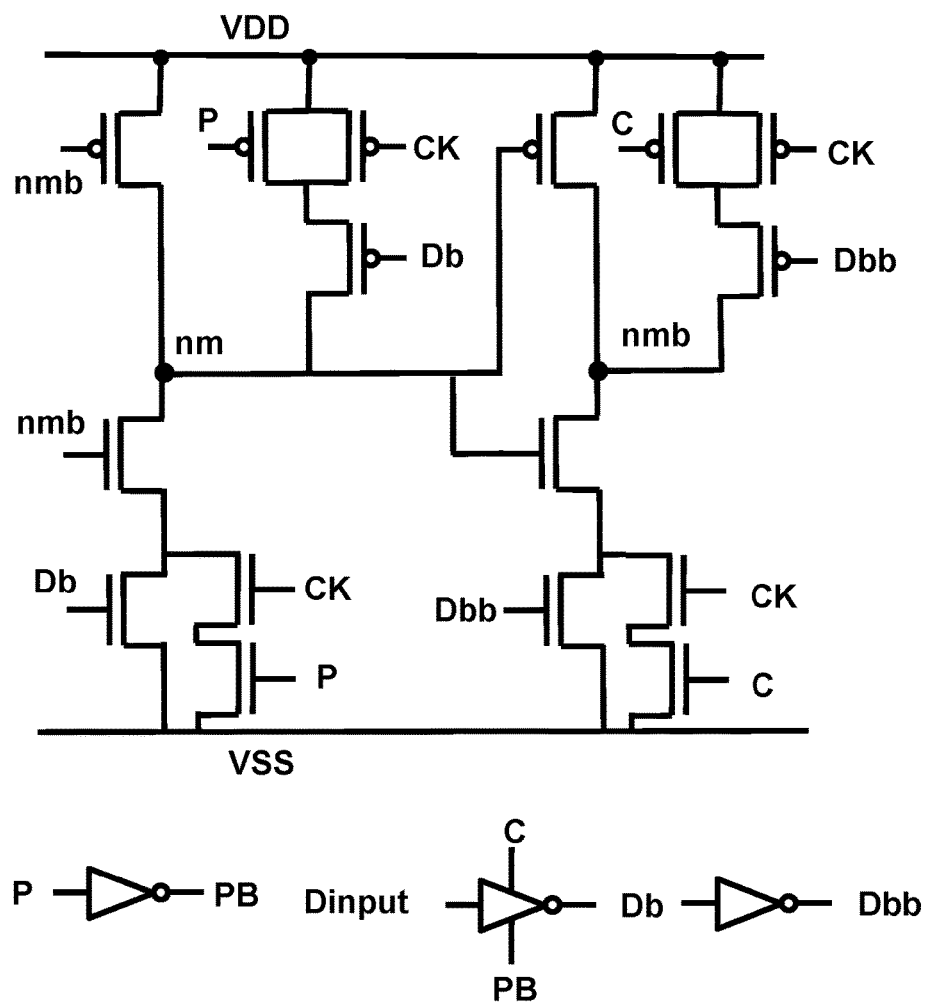
FIG. 14 shows a first PC (preset and clear) variant for the first sequential logic circuit variant in this invention.

Asynchronous preset or clear requires that the data value of the sequential element is set (by the preset, P, and clear, C, signals) regardless of the value of the control signal of the sequential element, CK. Additional MOSFET devices must therefore be added to the sequential element to ensure that the data of the logic cell is set as it should by the clear, C, and preset, P, signals even if the control signal, CK, is such that the input signals (Dbb and Db) are not written to the sequential logic call. A first PC variant (preset-clear variant) circuit that accomplishes this for the first sequential logic cell variant of this invention is shown in FIG. 14.

In the INV branch of the original cross-coupled INV where the additional control MOSFETs of the first variant of this invention are connected to the data signal (Dbb), another n-type MOSFET with the signal C connected to its' gate is connected in series with the n-type MOSFET that has CK connected to its' gate. In the same branch another p-type MOSFET with C connected to its' gate is connected in parallel with the p-type MOSFET that has CK connected to its' gate. These two MOSFETs, with C connected to their gates, bypass the CK control signal and ensures that the input data value, Dbb, which is set low by the synchronous clear circuit added at the input of the logic cell, is written into the circuit, even when the regular control signal, CK, has the value (HIGH) that prevents the data to be written.

Similarly an n-type and a p-type MOSFET with the signal P connected to their gates are added in series (n-type) and in parallel (p-type) to the MOSFETs with the CK signal connected to their gates, in the other INV branch of the circuit. Together with the synchronous preset/clear circuit on the input, this circuit (FIG. 14) accomplishes an asynchronous preset and clear function. The circuit will work with either of the synchronous input control circuit of FIG. 13. If the clear dominant input circuit (right in FIG. 13) is selected, the total circuit will be clear dominant. If the preset dominant input circuit (left in FIG. 13) is selected, the total circuit will be preset dominant.

Figure 15:
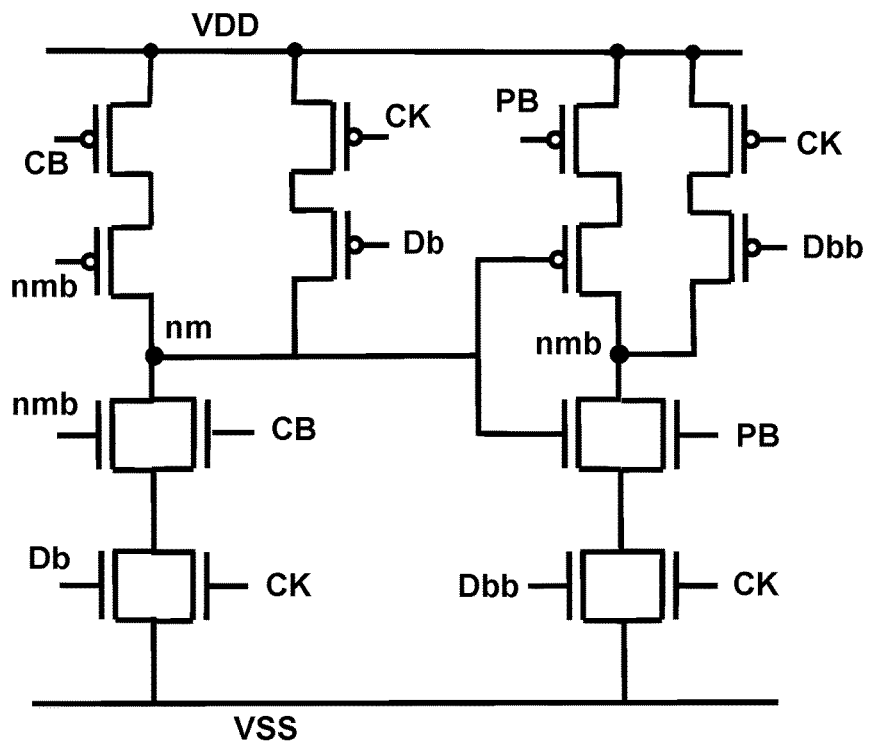
FIG. 15 shows a second PC (preset and clear) variant for the first sequential logic circuit variant in this invention.
Figure 15:
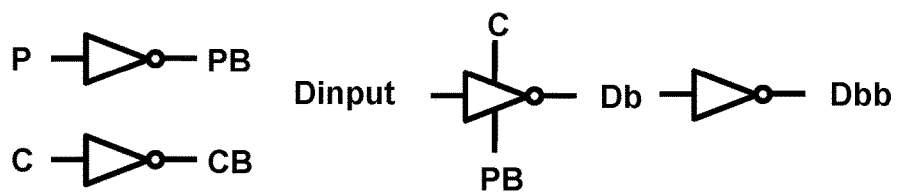

A second PC variant for the first circuit variant of the invention is shown in FIG. 15. In this circuit the same number of extra p-type and n-type MOSFETs are connected in the two INV branches of the original cross-coupled INV, but the gates are now connected to the complements of C and P, CB and PB, and they are connected so as to force the sequential element to attain the desired value directly, when the CK signal is set to not read the input, instead of by-passing the CK signal to read the correct value.

This second PC variant will operate as the first PC variant, except when both P and C are active (LOW). In this case (both P and C LOW), only one of the two storage nodes (the outputs of the cross-coupled INVs, nm and nmb) will be guaranteed to attain the correct value, and the output must be connected to this node. If the clear dominated synchronous preset-clear circuit from FIG. 13 is used, the output of the sequential element must be taken from the INV branch which has the additional preset and clear MOSFETs connected to the CB signal.

Figure 16:
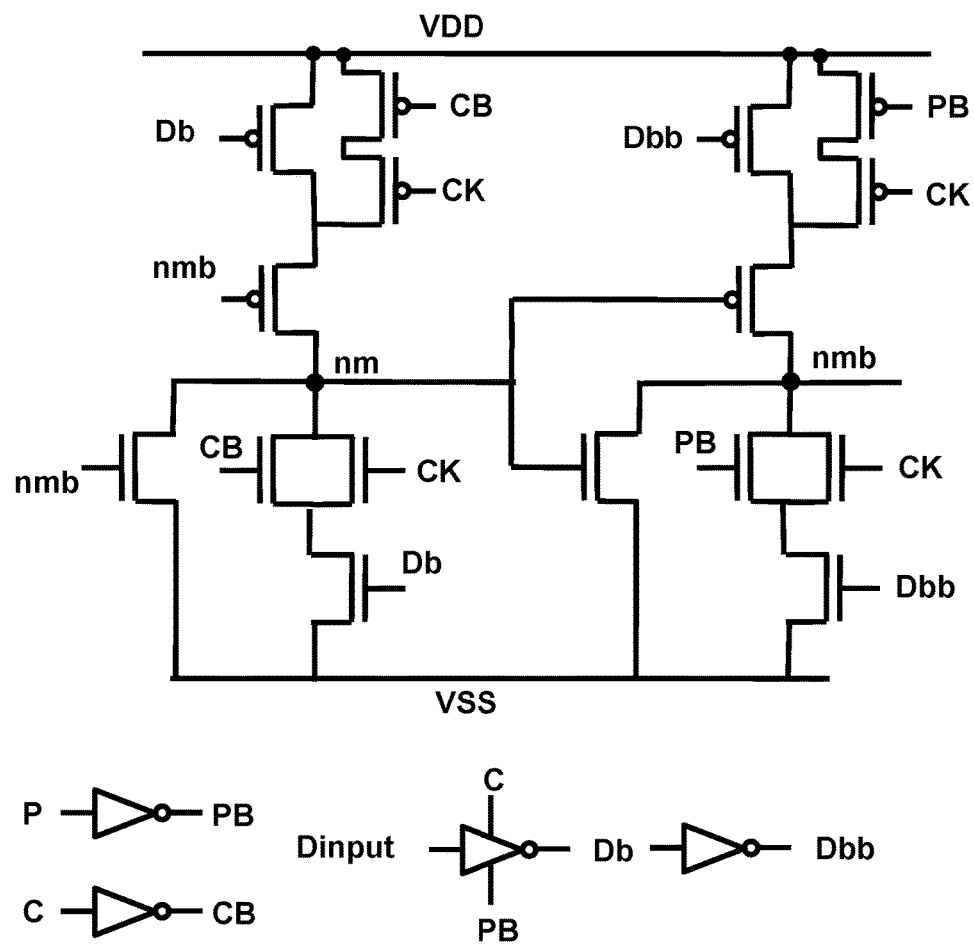
FIG. 16 shows a first PC (preset and clear) variant for the second sequential logic circuit variant in this invention.
Figure 17:
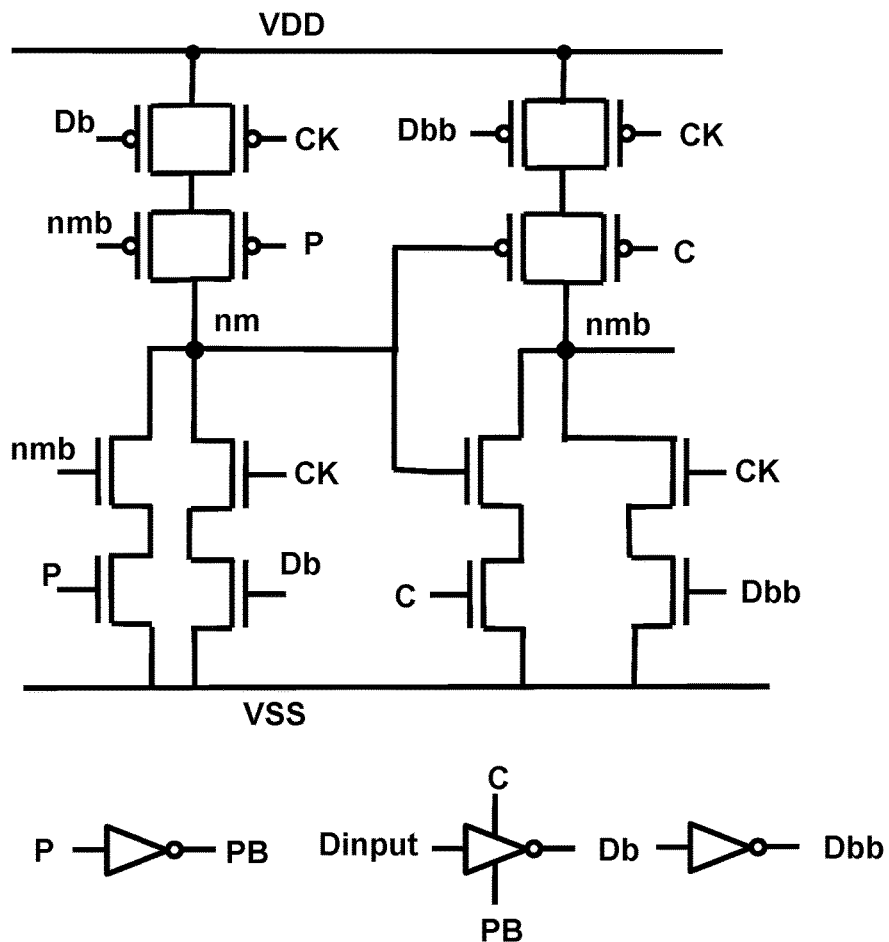
FIG. 17 shows a second PC (preset and clear) variant for the second sequential logic circuit variant in this invention.

In the same way as the two PC variant circuit are added to the first variant of the sequential cell in this invention, two PC variants can be added to the second variant of the sequential cell in this invention. The two resulting circuits are shown in FIGS. 16 and 17.

Figure 18:
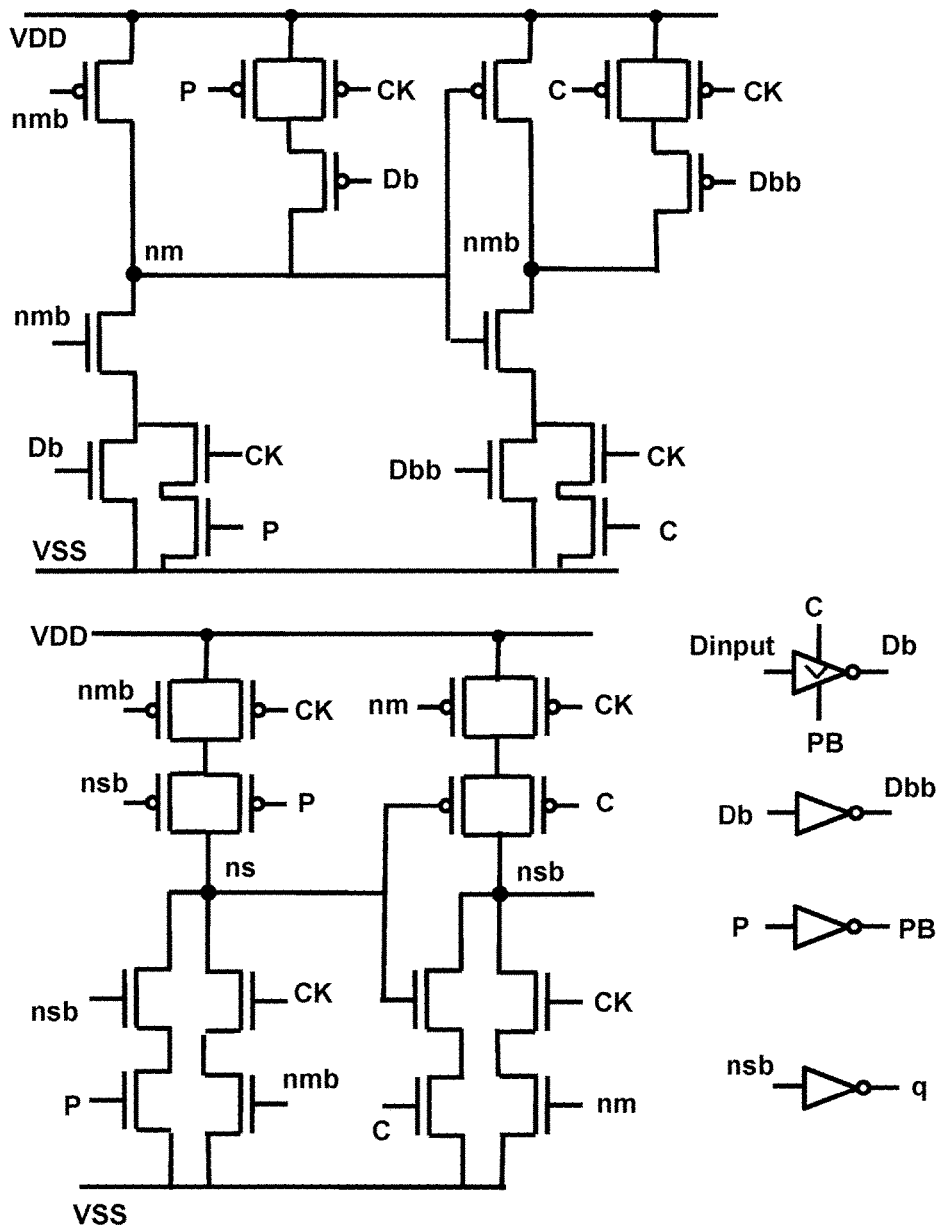
FIG. 18 shows a full flip-flop circuit with full asynchronous preset and clear functions using the both the first (master) and the second (slave) sequential logic cell variants of this invention.

A complete flip-flop with asynchronous preset and clear function can be created by combining the synchronous input circuit and two latches selected from the four different possible latches with asynchronous preset and clear function. One such complete asynchronous preset and clear flip-flop is shown in FIG. 18.

Figure 19:
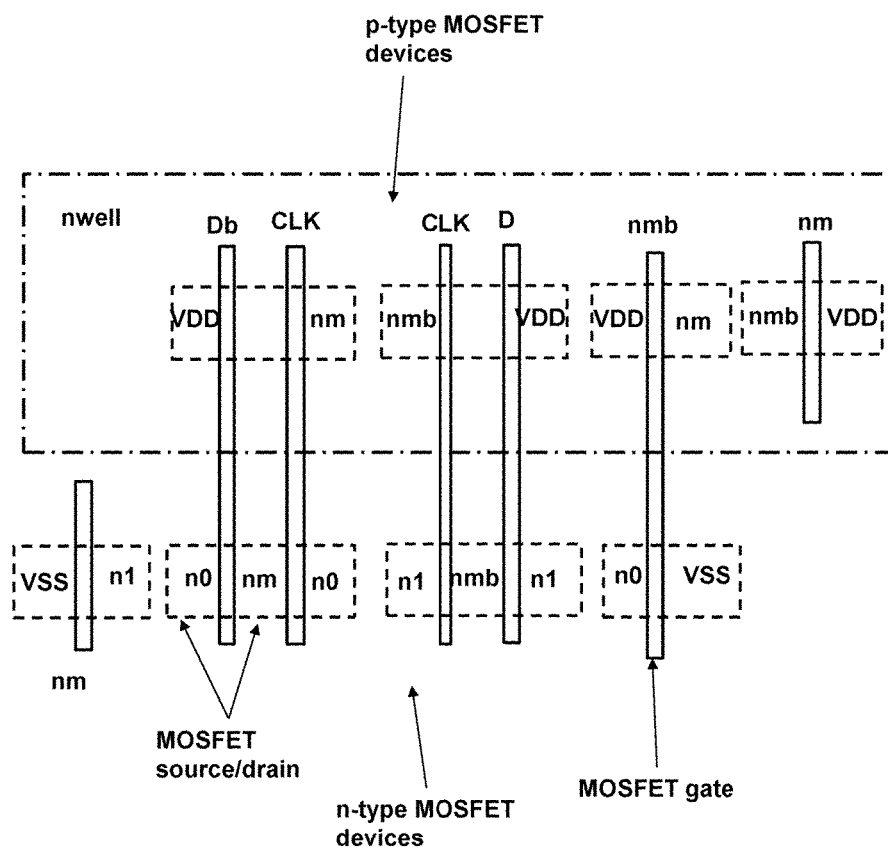
FIG. 19 shows a first layout alternative for the first variant of this invention (for the schematic from FIG. 6).
Figure 20:
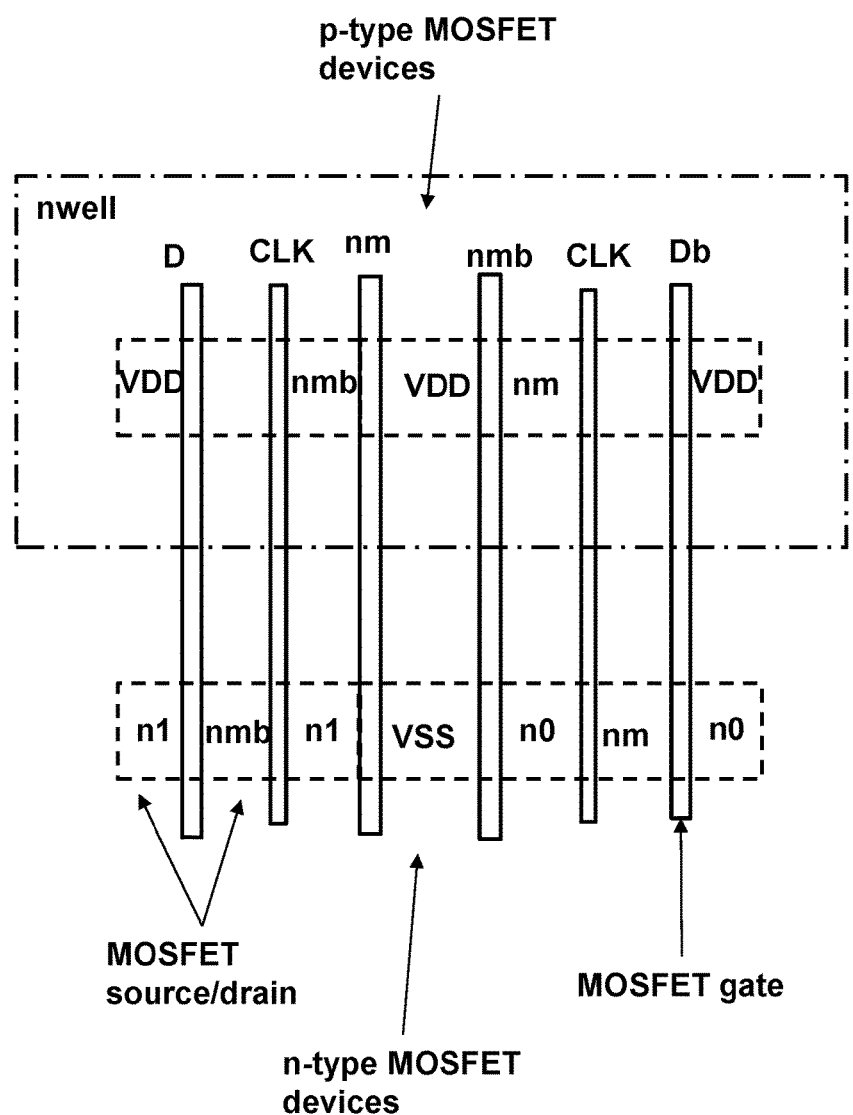
FIG. 20 shows a second layout alternative for the first variant of this invention (for the schematic from FIG. 6).

Asynchronous preset and clear functions can be added to the circuit variants in this invention that are based on the DICE circuit, i.e., the circuits in FIGS. 9 and 10, in the same way as described above for the circuit variants that are based on the cross-coupled INV pair When the new circuits of this invention are using a layout constructed according to the so called Layout design through Error Aware Positioning (LEAP) (e.g., U.S. Pat. No. 8,566,770 B2), sequential logic cells can constructed that are particularly effective in preventing so call soft errors. Two such principle layouts for the two sequential cell variants in this invention are shown in FIGS. 19 and 20.

I claim:

1. An integrated circuit with three input signals, D, Db, and CK, whereby Db is the complement (inverse) of D, implementing a clocked latch function, consisting of 12 MOSFET devices connected between a higher voltage level (VDD) and a lower voltage level (VSS), consisting of:
   a) A first p-type MOSFET with its source connected to VDD, its drain connected to a circuit node denoted nm, and its gate connected to a circuit node denoted nmb,
   a second p-type MOSFET with its source connected to VDD, its drain connected to a circuit node denoted pp0, and its gate connected to Db,
   a third p-type MOSFET with its source connected to the node pp0 and its drain connected to the circuit node nm, and its gate connected to CK,
   a fourth p-type MOSFET with its source connected to VDD, its drain connected to the circuit node nmb, and its gate connected to the circuit node nm,
   a fifth p-type MOSFET with its source connected to VDD, its drain connected to a circuit node denoted pp1, and its gate connected to D,
   a sixth p-type MOSFET with its source connected to the node pp1, its drain connected to the circuit node nmb, and its gate connected to CK,
   a first n-type MOSFET with its source connected to VSS, its drain connected to a circuit node denoted nn0, and its gate connected to the circuit node nmb, a second n-type MOSFET with its source connected to the circuit node nn0, its drain connected to the circuit node nm, and its gate connected to Db, a third n-type MOSFET with its source connected to the circuit node nn0, its drain connected to the circuit node nm, and its gate connected to CK, a fourth n-type MOSFET with its source connected to VSS, its drain connected to a circuit node denoted nn1, and its gate connected to the circuit node nm, a fifth n-type MOSFET with its source connected to the circuit node nn1, its drain connected to the circuit node nmb, and its gate connected to D, a sixth n-type MOSFET with its source connected to the circuit node nn1, its drain connected to the circuit node nmb, and its gate connected to CK.

2. An integrated circuit with three input signals, D, Db, and CK, whereby Db is the complement (inverse) of D, implementing a clocked latch function, consisting of 12 MOSFET devices connected between a higher voltage level (VDD) and a lower voltage level (VSS), consisting of:

a) A first p-type MOSFET with its source connected to VDD, its drain connected to a circuit node denoted pp0, and its gate connected to a circuit node denoted nmb, a second p-type MOSFET with its source connected to pp0, its drain connected to a circuit node denoted nm, and its gate connected to Db, a third p-type MOSFET with its source connected to the node pp0 and its drain connected to the circuit node nm, and its gate connected to CK, a fourth p-type MOSFET with its source connected to VDD, its drain connected to a circuit node denoted pp1, and its gate connected to the circuit node nm, a fifth p-type MOSFET with its source connected to pp1, its drain connected to the circuit node nmb, and its gate connected to D, a sixth p-type MOSFET with its source connected to the node pp1, its drain connected to the circuit node nmb, and its gate connected to CK, a first n-type MOSFET with its source connected to VSS, its drain connected to the circuit node nm, and its gate connected to the circuit node nmb, a second n-type MOSFET with its source connected to VSS, its drain connected to a circuit node denoted nn0, and its gate connected to Db, a third n-type MOSFET with its source connected to the circuit node nn0, its drain connected to the circuit node nm, and its gate connected to CK, a fourth n-type MOSFET with its source connected to VSS, its drain connected to the circuit node nmb, and its gate connected to the circuit node nm, a fifth n-type MOSFET with its source connected to VSS, its drain connected to a circuit node denoted nn1, and its gate connected to D, a sixth n-type MOSFET with its source connected to the circuit node nn1, its drain connected to the circuit node nmb, and its gate connected to CK.

* * * * *